(12) United States Patent
Castor-Perry

(10) Patent No.: US 9,002,488 B2
(45) Date of Patent: Apr. 7, 2015

(54) CLOCK SYNTHESIS SYSTEMS, CIRCUITS AND METHODS

(75) Inventor: Kendall Castor-Perry, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 772 days.

(21) Appl. No.: 12/981,265

(22) Filed: Dec. 29, 2010

(65) Prior Publication Data

US 2011/0208329 A1 Aug. 25, 2011

Related U.S. Application Data

(60) Provisional application No. 61/321,602, filed on Apr. 7, 2010, provisional application No. 61/306,612, filed on Feb. 22, 2010.

(51) Int. Cl.
| | |
|---|---|
| G06F 17/00 | (2006.01) |
| H04H 40/54 | (2008.01) |
| G06F 1/08 | (2006.01) |
| H03L 7/081 | (2006.01) |
| H03L 7/18 | (2006.01) |

(52) U.S. Cl.
CPC ........ *G06F 1/08* (2013.01); *H03L 7/081* (2013.01); *H03L 7/18* (2013.01)

(58) Field of Classification Search
CPC ........ G06F 1/08; H03K 23/667; H03L 7/081; H03L 7/1976
USPC ................ 700/94; 331/4, 1 A; 327/156, 117; 375/130; 455/570, 63; 381/7
See application file for complete search history.

(56) References Cited

U.S. PATENT DOCUMENTS

| | | | |
|---|---|---|---|
| 5,038,117 A | | 8/1991 | Miller |
| 6,057,791 A | * | 5/2000 | Knapp .......................... 341/122 |
| 6,169,912 B1 | * | 1/2001 | Zuckerman ................... 455/570 |
| 6,236,703 B1 | | 5/2001 | Riley |
| 6,967,513 B1 | | 11/2005 | Balboni |
| 7,078,946 B2 | | 7/2006 | Der et al. |
| 7,079,616 B2 | | 7/2006 | Castiglione et al. |
| 7,162,002 B2 | | 1/2007 | Chen et al. |
| 7,471,123 B2 | | 12/2008 | Holland et al. |

(Continued)

FOREIGN PATENT DOCUMENTS

| | | |
|---|---|---|
| CN | 1257349 | 5/2006 |
| CN | 101242185 B | 3/2011 |
| JP | 2007288375 A | 11/2007 |
| WO | 0157620 A2 | 8/2001 |

OTHER PUBLICATIONS

International Search Report for International Application No. PCT/US11/25780 dated Oct. 6, 2011; 3 pages.

(Continued)

*Primary Examiner* — Fan Tsang
*Assistant Examiner* — Eugene Zhao

(57) ABSTRACT

A clock synthesis system may include a feed forward divider circuit configured to divide a source clock signal by one of a plurality of integers in response to a select signal to generate a reference clock that is synchronous to a synchronous pulse; a modulator that modulates the select signal in response to at least a difference value; a multiplier circuit that frequency multiplies the reference clock to generate an output clock; and a timing circuit that generates the difference value in response to the source clock and synchronous pulse.

20 Claims, 10 Drawing Sheets

(56) References Cited

U.S. PATENT DOCUMENTS

| | | | |
|---|---|---|---|
| 7,800,451 B2* | 9/2010 | Fu et al. | 331/4 |
| 2002/0109554 A1* | 8/2002 | Gailhard et al. | 331/57 |
| 2006/0132200 A1 | 6/2006 | Dietl | |
| 2008/0061949 A1 | 3/2008 | Ferguson et al. | |
| 2008/0260071 A1 | 10/2008 | Sidiropoulos et al. | |
| 2009/0325739 A1 | 12/2009 | Gold | |
| 2010/0045395 A1* | 2/2010 | Fu et al. | 331/179 |
| 2011/0084768 A1* | 4/2011 | Hammond et al. | 331/18 |

OTHER PUBLICATIONS

Miller, B. et al., "A multiple modulator fractional divider", dated May 23, 1990.

SIPO Office Action for Chinese Application No. 201180008809.3 dated Jun. 24, 2014; 8 pages.

Written Opinion of the International Searching Authority for International Application No. PCT/US11/25780 dated Oct. 6, 2011; 3 pages.

* cited by examiner

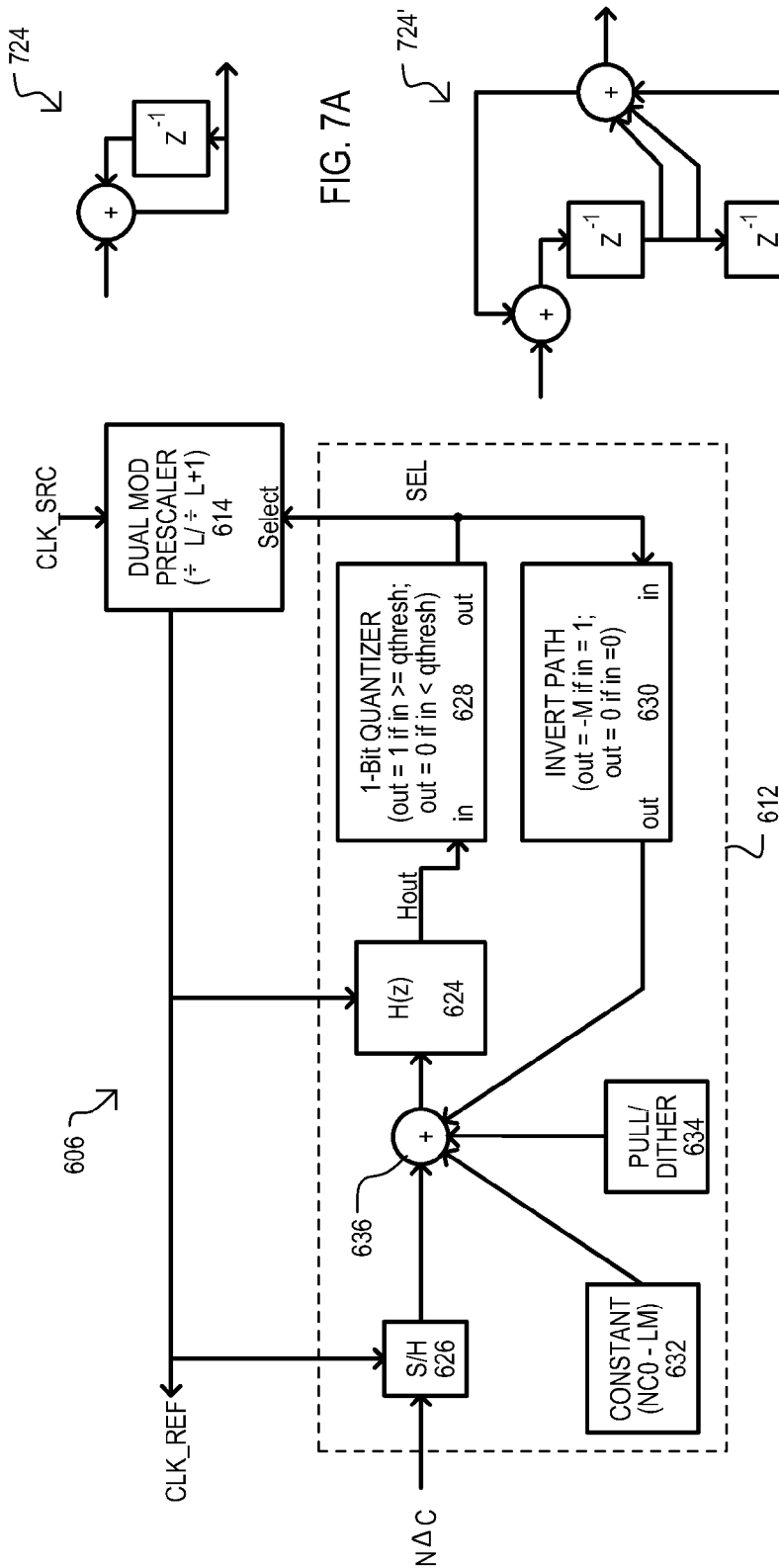

CLOCK SYNTHESIS SYSTEMS, CIRCUITS AND METHODS

This application claims the benefit U.S. provisional patent applications having Ser. No. 61/321,602 filed on Apr. 7, 2010 and Ser. No. 61/306,612 filed on Feb. 22, 2010, the contents of which are incorporated by reference herein.

TECHNICAL FIELD

The present disclosure relates to the generation of timing signals, and more particularly to rapidly generating a clock signal synchronous to a lower frequency synchronizing signal or event.

BACKGROUND

In some electronic systems or devices, it is desirable to synchronize a clock signal to some defined standard or an external repetitive event. However, generating such a clock signal can present challenges when the target frequency is very high with respect to the synchronizing event, and the clock must be exact (i.e., relatively low jitter) and fast responding with respect to the synchronizing event.

One particular environment where such clock requirements can be important is a system having data conversion circuits that operate at a relatively high frequency with respect to a rate at which data is received. As but one very particular example, audio data may be received at an interface (e.g., serial interface) associated with a relatively low frequency signal be converted into analog audio signals by digital-to-analog converters (DACs) operating at a sampling rate that is tens of thousands of times faster than the low frequency signal. For sufficient performance, a clock signal must not only meet the sampling rate, but it must also be rigorously locked (e.g., low jitter) to the lower frequency signal. Further, the clock synthesis approach should be capable of rapidly responding to changes in the lower frequency signal.

Clock multiplication using one or more phased lock loops (PLLs) is known. However, achieving very large multiplication factors with a single PLL may suffer from unacceptably high amounts of phase noise. Higher phase precision may be achieved by employing multiple PLLs. However, such solutions may undesirably increase response time, and may be more expensive to implement when realized with a single integrated circuit device.

BRIEF DESCRIPTION OF THE DRAWINGS

FIG. 6 shows a reference clock generating circuit according to an embodiment.

FIGS. 7A and 7B are block diagrams of transfer functions that may be included in noise shaping sections of embodiments.

DETAILED DESCRIPTION

Figure 1:
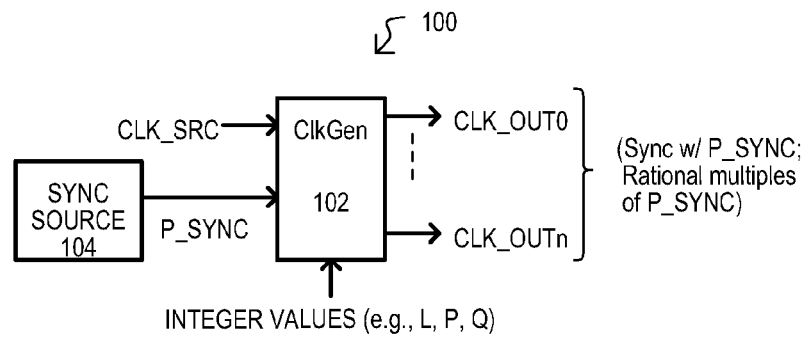
FIG. 1 shows a clock synthesis system according to one embodiment.

Various embodiments will now be described that show systems, circuits and methods of generating an output clock signal that is an exact rational multiple of, and therefore synchronous with, a lower frequency synchronizing signal or event. A resulting reference clock signal may be further multiplied to arrive at one or more output clocks that are locked to the synchronizing signal/event.

In the embodiments described below, like sections may be referred to by the same reference character but with the leading digits corresponding to the figure number.

Embodiments may utilize an initial rapid integer dividing stage in combination with a control method to generate a reference clock signal. The reference clock signal may be further processed by a phase locked loop (PLL) circuit. More particularly, a dividing stage may divide a source clock by different integer values according to a sequence to generate a reference clock, while a PLL may multiply the reference clock by a multiplying value to generate the output clock, where such a multiplying value may be an integer or a rational number. Dividing stage integer values and sequence and PLL division/multiplication values may be selected to arrive at an output clock having a frequency at a desired rational multiple of the synchronizing clock signal.

Referring now to FIG. 1, a clock synthesis system according to an embodiment is shown in a block schematic diagram and designated by the general reference character 100. A clock synthesis system 100 may include a clock generator circuit 102 and a synchronizing source circuit 104. A clock generator circuit 102 may receives a source clock CLK_SRC and a synchronous signal or event P_SYNC. In response to such values, clock generator 102 may generate one or more output clocks CLK_OUT0 to CLK_OUTn. An output clock (any of CLK_OUT0 to CLK_OUTn) may have a frequency that is a rational multiple of the frequency of P_SYNC (i.e., $W*f_{P\_SYNC}$, where W is a rational constant and $f_{P\_SYNC}$ is the frequency of P_SYNC).

In one particular embodiment, the rational constant W may be arrived at by establishing integer values for the clock generator 102, which in the very particular embodiment shown may include integers L, P and Q. In a particular embodiment, one or more of such integer values (e.g., L) may be used by a suitable dividing sequence to arrive a reference frequency, while other integer values (e.g., P, Q) may be used as frequency multiplier and/or divider values to arrive at the overall rational constant W. However, such an integer-based configurability may be for user ease of use, and in alternate embodiments, a value W may be arrived at using one or more non-integer values.

In some embodiments, a rational constant W may be relatively large value, being greater than 1000, even more particularly greater than 5000, even more particularly about 10,000 or larger.

In the embodiment of FIG. 1, signal/event P_SYNC may arrive from a synchronous source 104. While a synchronous source 104 may provide a P_SYNC signal having a given frequency, P_SYNC may be intermittent. As but one example, a synchronous source may be a communication link. When a device is operating on the link, signal P_SYNC may be present. However, when a device is not operating on the link, P_SYNC may not be present. Clock generator circuit 102 may generate corresponding output signals (CLK_OUT0 to CLK_OUTn) as a signal P_SYNC is present and/or changes.

In a very particular embodiment, clock generating circuit 102 may generate "free running" output signals (CLK_OUT0 to CLK_OUTn) in the absence of a P_SYNC signal. Such signals may be close to expected output signals (e.g., about W*P_SYNC), to enable rapid tracking once a P_SYNC signal is received.

A source clock (CLK_SRC) may be a reliable clock signal, having a stable frequency substantially greater than that of signal/event P_SYNC. The amount by which a CLK_SRC frequency is greater than a P_SYNC frequency may vary according to application. In some embodiments, a CLK_SRC frequency may be at least 1,000 times greater than a P_SYNC frequency, more particularly, more than 5,000 times greater than P_SYNC. However, in other embodiments a CLK_SRC frequency may be more than 20,000 times greater than a P_SYNC frequency. CLK_SRC may be present whenever a signal/event P_SYNC is present.

In this way, a clock synthesis system may generate one or more output values that are relatively large rational multiples of a synchronous signal/event, in response to the synchronous signal/event and a source clock signal.

Figure 2:
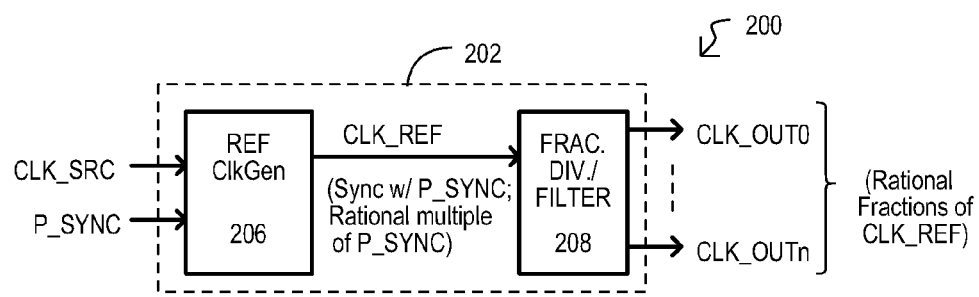
FIG. 2 shows a clock synthesis system according to another embodiment.

Referring now to FIG. 2, a clock synthesis system according to another embodiment is shown in a block schematic diagram and designated by the general reference character 200. A clock synthesis system 200 may include a clock generator circuit 202 that includes a reference clock generator 206 and a multiplier/filter circuit 208. Accordingly, a clock generator 202 may be conceptualized as implementing a two-stage process, a first stage executed by reference clock generator 206, and a second stage executed by a multiplier/filter circuit 208.

A reference clock generator 206 may generate a reference clock CLK_REF in response to a source clock CLK_SRC and a synchronous signal/event P_SYNC. Reference clock CLK_REF may be synchronous with, and a rational multiple of, P_SYNC, as described above. However, a source clock CLK_SRC and/or a reference clock CLK_REF may have some slight variations in phase. For example, in one embodiment, a frequency spectrum of CLK_REF may have a fundamental component at a desired frequency, but also include some smaller amplitude sideband frequencies outside of a desired frequency range components.

A multiplier/filter 208 may multiply a frequency of CLK_REF by a rational number to arrive at one or more output clock values (CLK_OUT0 to -n) that are rational multiples of CLK_REF. In addition, a multiplier/filter 208 may filter CLK_REF to remove sideband frequency components noted above. Consequently, output clock values (CLK_OUT0 to -n) may be synchronous with P_SYNC, with no or substantially small phase variation in pulses, and thus be accurate timing signals with respect to P_SYNC.

In one embodiment, a clock synthesis system may be one implementation of that shown in FIG. 1.

In this way, a clock synthesis system may generate a reference clock that is a large rational multiple of a synchronous signal/event, and then frequency multiply and filter the reference clock to arrive at one or more output clock signals.

Figure 3:
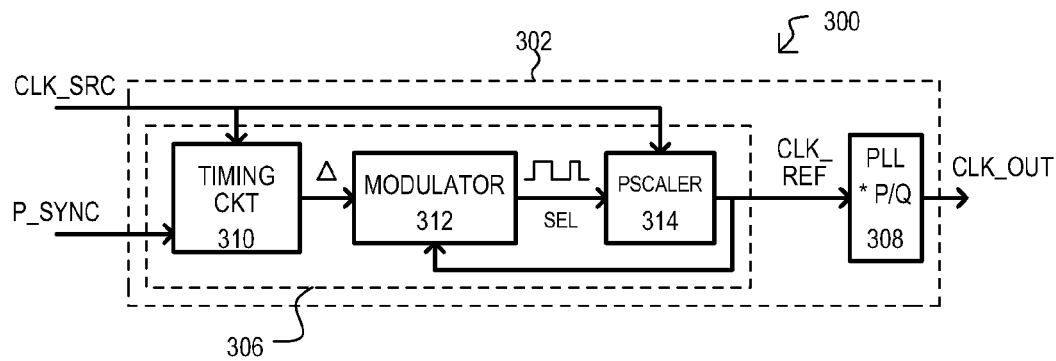
FIG. 3 shows a clock synthesis system according to an embodiment.

Referring now to FIG. 3, a clock synthesis system according to another embodiment is shown in a block schematic diagram and designated by the general reference character 300. A clock synthesis system 300 may include a reference clock generator 306 and a phase locked loop (PLL) circuit 308. In the embodiment shown, reference clock generator 306 may include a timing circuit 310, a modulator circuit 312, and a prescaler circuit 314. A timing circuit 310 may measure any difference between a frequency of CLK_SRC with that of P_SYNC, and compare it to an ideal value. Such a comparison may generate a difference value ($\Delta$) that represents the amount by which a CLK_SRC needs to be scaled to arrive at a desired CLK_REF frequency. In a particular embodiment, in the absence of P_SYNC, timing circuit 310 may output a "free running" difference value (which can represent $\Delta=0$, in some embodiments).

A modulator circuit 312 may modulate a difference value ($\Delta$) (and, optionally additional values) into a modulator output MOUT. In some embodiments, a modulator 312 may be a "delta-sigma" modulator that encodes a multi-bit difference value into a two-state output signal having a time-density function of the difference value ($\Delta$).

A prescaler circuit 314 may frequency divide a source clock CLK_SRC to generate a reference clock (CLK_REF). The amount by which a CLK_SRC frequency is divided may vary according to modulator output SEL. In a particular embodiment, a prescaler circuit 314 may divide CLK_SRC by one of multiple integer values selected according to SEL. Consequently, as differences arise between P_SYNC and CLK_SRC, according to the output of modulator circuit 312 (SEL) prescaler circuit 314 may divide by different integer values to ensure CLK_REF continues to accurately track P_SYNC.

It is noted that prescaler circuit 314 in combination with modulator circuit 312 may provide an initial stage that arrives at a desired reference clock CLK_REF frequency in a rapid fashion, particularly as compared to a PLL.

PLL circuit 308 may multiply CLK_REF by a multiplication factor to generate an output clock CLK_OUT. In the embodiment shown, PLL circuit 308 may have feedback and reference divider values of P and Q such that $$CLK\_OUT=CLK\_REF*P/Q.$$

Values P and Q may be integer values, thus P/Q may form a rational multiplier value. Filtering effects of a PLL circuit 308 may also serve to suppress side band frequencies inherent in CLK_REF that may vary from a desired fundamental frequency.

In one embodiment, a clock synthesis system 300 may be one implementation of that shown in FIGS. 1 and/or 2.

It is noted that FIG. 3 may be conceptualized as including a "feed-forward" stage in reference clock generator 306. Such a feed-forward stage (e.g., 306), in combination with PLL 308 (a feedback stage), can enable rapid generation of an output signal (CLK_OUT) that is synchronized to a much lower frequency P_SYNC. This is in contrast to approaches that may utilize multiple feedback stages (e.g., multiple PLL solutions), requiring longer response times.

In this way, a clock synthesis system may generate a reference clock by frequency dividing a source clock by two or more integer values that vary in response to differences between the source clock and a synchronizing signal.

Figure 4:
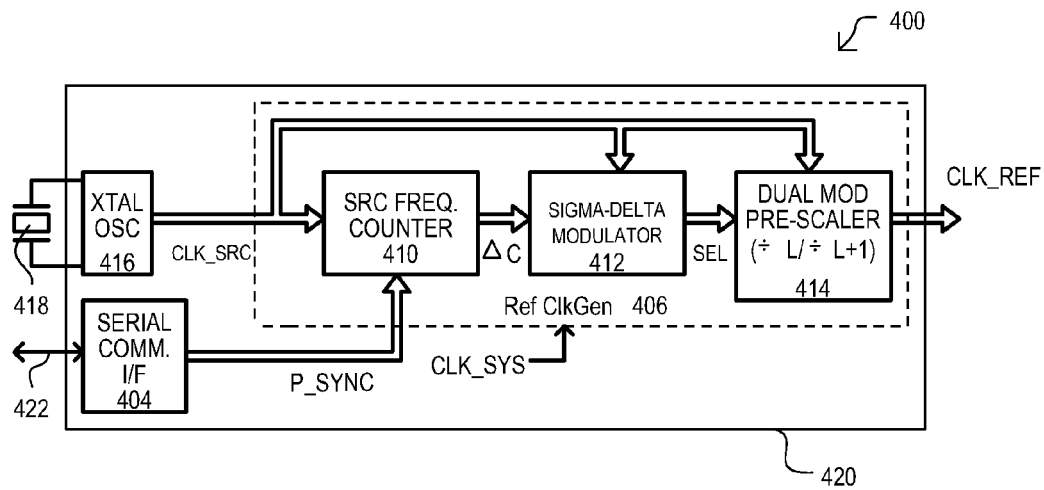
FIG. 4 shows a reference clock generating circuit according to an embodiment.

Referring now to FIG. 4, a clock synthesis system according to another embodiment is shown in a block schematic diagram and designated by the general reference character 400. A clock synthesis system 400 may include a reference clock generator 406, a synchronous source 404, and a crystal oscillator circuit 416.

A reference clock generator 406 may generate a reference clock CLK_REF in response to a source clock signal CLK_SRC and synchronizing signal/event (P_SYNC). In the embodiment shown, reference clock generator 406 may include a source frequency counter 410, a sigma-delta modulator 412, and a dual modulus prescaler 414. A source frequency counter 410 may be a counter circuit that is driven (e.g., incremented/decremented) by CLK_SRC, and has an end count value gated by P_SYNC. This end count value may thus represent any difference arising between P_SYNC and CLK_SRC, and is shown as difference value ΔC in FIG. 4. In some embodiments, a source frequency counter 410 may be preset to a nominal value Cnom at that the start of each counting period, and a counter may decrement such a value to arrive at ΔC. In some embodiments, a value ΔC may be a signed value, and in the absence of signal P_SYNC, a difference value ΔC may be zero. Alternatively, Cnom may be sufficiently large to generate an unsigned difference value ΔC, and source frequency counter 410 may output a predetermined value in absence of P_SYNC.

Various alternate approaches may utilized to arrive at difference value ΔC, including resetting a count value to a start count (such as zero), and incrementing such a value. Still other approaches would be well understood by those skilled in the art.

A sigma-delta modulator 412 may receive difference value ΔC and encode such a value to generate a binary select signal SEL.

Dual modulus prescaler 414 may frequency divide a source clock CLK_SRC by an integer value L or L+1 according to select signal SEL. Consequently, it is understood that reference clock generator 406 may operate under the constraint:

$$L \leq f_{CLK\_SRC}/f_{CLK\_REF} \leq (L+1)$$

where $f_{CLK\_SRC}$ is the frequency of CLK_SRC and $f_{CLK\_REF}$ is the frequency of CLK_REF.

A synchronous source 404 may provide a P_SYNC value to frequency counter 404. In the embodiment of FIG. 4, synchronous source 404 may be a serial communications interface (I/F) 404 that may receive and or transmit data on a serial communications link 422. P_SYNC may be a timing signal associated with serial communications along link 422. In one embodiment, P_SYNC may be a start-of-frame (SoF) signal indicating how serial data is organized.

A crystal oscillator circuit 416 may generate a stable source clock signal CLK_SRC that may be established by crystal 418. A crystal oscillator circuit 416 may provide a stable frequency clock for manipulation by reference clock generator circuit 406 to generate a reference clock CLK_REF.

In the embodiment of FIG. 4, reference clock generator circuit 406, crystal oscillator circuit 416, and synchronous source 420 may be part of a same integrated circuit (IC) device 420. IC device 420 may receive serial data via an external link that may be connected to the IC device 420. In addition, circuits on the IC device may operate according to a system clock CLK_SYS that is not synchronized with CLK_SRC or P_SYNC. CLK_SYS may be generated on the IC device 420, or may be an externally received clock.

The embodiment of FIG. 4 may be included in other embodiments disclosed herein

In this way, a clock generator circuit may generate an output clock synchronous with a synchronization signal by controlling a dual modulus prescaler with sigma-delta modulation of a count value. The count value may be generated by measuring the number of source clock counts occurring between synchronization pulses.

Figure 5:
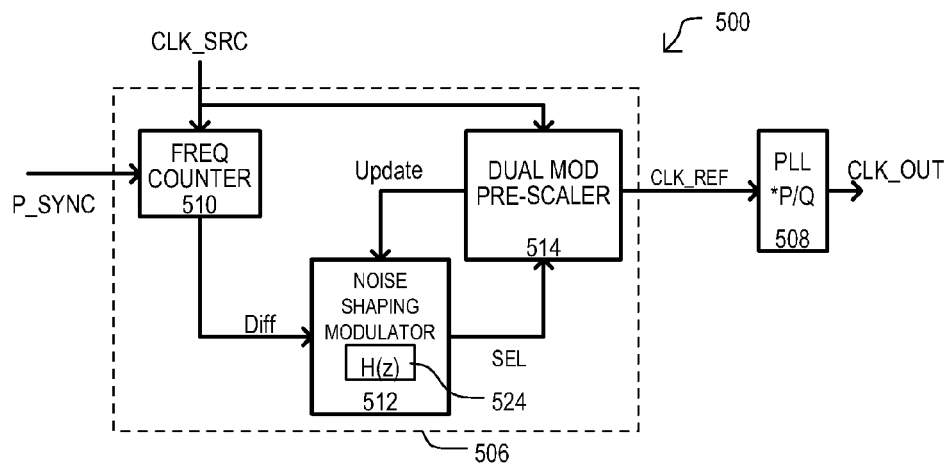
FIG. 5 shows a clock synthesis system circuit according to an embodiment.

Referring now to FIG. 5, a clock synthesis system according to another embodiment is shown in a block schematic diagram and designated by the general reference character 500. A clock synthesis system 500 may include a reference clock generator 506 and a PLL 508.

A reference clock generator 506 may have components like those shown in FIG. 4. FIG. 5 differs from that of FIG. 4 in that modulator 512 is specifically shown to include a noise shaping response 524 (represented as a transfer function H(z)). A noise shaping response 524 may provide a low pass response to the input signal, and a high pass response to quantization noise arising from the modulation operation (e.g., quantization of multi-bit difference value into a two state output signal SEL).

In this way, a clock generator circuit may generate an output clock synchronous with a synchronization signal by dividing a source clock according to a modulation value generated in response to a number of source clock counts occurring within a synchronization pulse.

Referring now to FIG. 6, one particular example of a reference clock generator is shown in block schematic diagram and designated by the general reference character 606. A reference clock generator 606 may be included as a reference clock generator for other embodiments disclosed herein. A reference clock generator 606 may include a modulator 612 and a dual modulus prescaler 614.

In the embodiment shown, a modulator 612 may include an input register 626, an adder 636, a function 624, a 1-bit quantizer 628, an invert path 630, an offset register 632, and optionally, a pull and/or dither register 634. An input register 626 may periodically receive a difference value (NΔC). Difference value NΔC may represent differences between a synchronization signal (e.g., P_SYNC) and a source clock (CLK_SRC), as described herein, and equivalents. In one embodiment, difference value may be a count value ΔC multiplied by a scaling factor N. Such values may vary according to application, and very particular examples showing the derivation of such values will be described in more detail below.

Adder 636 may be a multi-bit adder that adds the difference value (NΔC) and other values from offset register 632, invert path 630, and (if included) pull/dither register 634. A resulting sum may be provided to function 624. Particular examples of such functions will be described in more detail below.

Quantizer 628 may quantize an output from function 624 into a 1-bit pulse stream SEL. In the embodiment shown, quantizer 628 may compare a multi-bit output (Hout) from section 624 to a threshold value (qthresh). In particular, if Hout is greater or equal to qthresh, quantizer may output an SEL value "1", and if Hout is less than qthresh, quantizer may output an SEL value "0".

Invert path 630 may selectively feed back a scaled select value in response the SEL value output from quantizer 628. In the embodiment shown, invert path 630 may output a negative modulator scaling value (−M) if SEL is "1", or may output zero is SEL is "0". A value M may also vary according to application, and very particular examples showing the derivation of such a value will be described in more detail below.

Offset register 632 may provide a constant offset to adder 636. Such a value may also vary according to application. In the embodiment shown, such a constant may be N*C0−L*M, where N and M have been noted above, L is one of the dual modulus divider integers (L+1 being the other), and C0 may be an initial count value for frequency counter (not shown) that generates the difference value ΔC (i.e., measured count C−C0=ΔC).

Pull/Dither register 634 may provide a pull value that may be used to bias a response of modulator 612 to introduce a small shift in frequency, if desired. A pull/dither register 634 may also provide a dither value that may introduce noise that can break up the undesirable side bands outside of a desired fundamental frequency (or set of frequencies). In one embodiment, a dither value may be a pseudorandom number, generated by a pseudorandom binary sequence (PRBS) generator circuit.

In the embodiment shown, modulator 612 may update a value each time the prescaler 614 counts to its current dividing limit (i.e., L or L+1). More particularly, each time a pulse is generated from prescaler 614, function 624 may output a previously generated value Hout, and input register 626 may provide a new difference value (NΔC). In response, adder 636 may provide a new value to function 624 to operate on to generate the Hout value for a next cycle.

Referring now to FIGS. 7A and 7B, particular implementations of noise shaping sections that may be included in modulator embodiments are shown in block diagrams. It is understood that the noise shaping sections shown are but examples, and embodiments may include noise shaping sections having different responses. The sections of FIGS. 7A and 7B are loop functions, and can have a response, as represented in z-transform format, of:

$$\text{out}(t) = \frac{H(z)}{1+H(z)} * \text{int}(t) + \frac{1}{1+H(z)} * e(t),$$

which can be expressed as $$\text{out}(t) = STF * \text{int}(t) + NTF * e(t)$$

where STF can be the signal transfer function, and NTF can be the noise transfer function.

Referring to FIG. 7A, one example of a noise shaper section is shown in a block schematic diagram and designated by the general reference character 724. Noise shaper section 724 is represented in z-transform format, and includes an adder and a block that feeds back a value from a previous cycle. In such a first order case:

$$H(z) = \frac{z^{-1}}{1-z^{-1}}$$

which results in $$NTF = 1 - z^{-1}.$$

Referring to FIG. 7B, a second order example is shown in a block diagram. In such a second order case $$H(z) = \frac{2z^{-1} - z^{-2}}{1 - 2z^{-1} + z^{-2}}$$

which results in $$NTF = (1-z^{-1})^2.$$

Other embodiments may include higher order loop functions.

In this way, a modulator transfer function may be a noise shaper with a loop function that may serve to reduce an error component resulting from a modulation operation.

One example of how values may be derived for a desired output frequency will now be described. It is assumed that a system includes a reference clock generator, like that of FIG. 6, and a PLL like that of FIG. 5 (that frequency multiplies by P/Q). A desired output clock frequency may have following relationship:

$$f_{CLK\_OUT} = W * f_{P\_SYNC} = f_{CLK\_REF} * P/Q.$$

where W is a rational constant multiplier value, and P and Q are integer values selectable for the PLL.

Arriving at a desired reference frequency will involve dividing a source frequency by an ideal division value as follows:

$$\text{division value} = C_{nom} * \frac{P}{Q*W}$$

where $C_{nom}$ is a nominal count value. Because a dual modulus prescaler is utilized to perform the division operation, such a division value may be between L and L+1. It is noted that alternate embodiments may include multi-modulus prescalers that may selectively frequency divide by more than one integer value.

A nominal division value $K_{nom}$ may be selected between L and L+1 and given as:

$$K_{nom} = C_{nom} * \frac{P}{Q*W} - L$$

As but one example, $K_{nom}$ may be selected to be about 0.5, but may have another value depending upon a desired CLK_OUT frequency. Because W is desired to be a rational number, the relationship may be simplified with a greatest common divisor (GCD) (N=P/GCD and M=Q*W/GCD):

$$K_{nom} = C_{nom} * \frac{N}{M} - L$$

which may then scale to $$K'_{nom} = C_{nom} * N - L * M$$

which may be the constant offset value for modulator 612.

From the above, given a synchronizing signal (e.g., P_SYNC) and a source clock (CLK_SRC) sufficiently faster than P_SYNC, system values (e.g., $C_{nom}$, L, P, Q) may be derived to arrive at an output clock having a frequency that is a desired rational multiple (W) of P_SYNC. It is noted that in some embodiments, all or a portion of such values may be configurable by a user to enable the generation of different output clock frequencies meeting the requirement W*P_SYNC. In one very particular embodiment, $C_{nom}$, P, and Q may be subject to some variability (e.g., programmable to values within a certain range by writing a register), while prescaler divider value L (and hence L+1) may be fixed by a hardware design.

Figure 8:
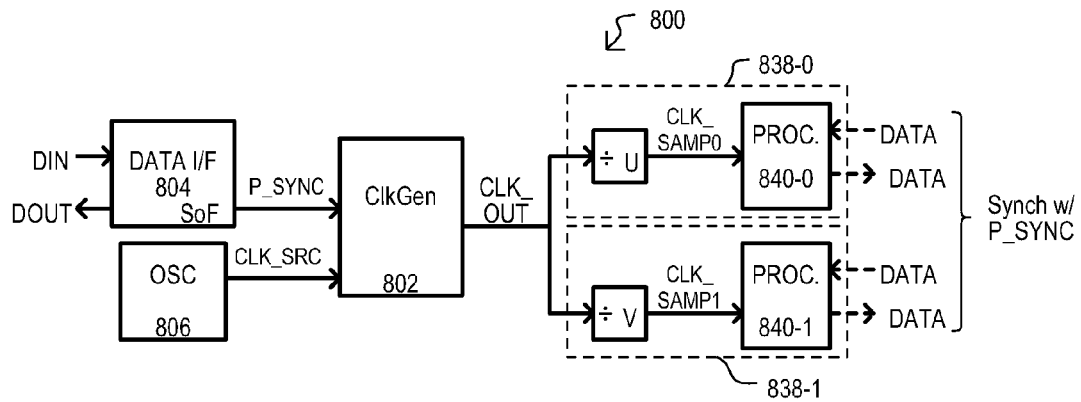
FIG. 8 shows a clock synthesis system according to an embodiment.

Referring now to FIG. 8, a clock synthesis system according to another embodiment is shown in a block schematic diagram and designated by the general reference character 800. A clock synthesis system 800 may include a clock generator circuit 802, a data I/F 804, a source clock circuit 806 and data processing circuits 838-0 and -1.

A clock generator circuit 802 may generate an output clock CLK_OUT that is synchronous with a synchronization signal/event (P_SYNC) in response to a source clock (CLK_SRC), as described herein and equivalents. Data I/F circuits 804 may receive and/or output data according to a predetermined protocol. Such data may be transmitted in frames identified by a start of frame (SoF) notification. A SoF notification from data I/F 804 may serve as the synchronizing event P_SYNC. A source clock circuit 806m may be an oscillator circuit that provides a clock (CLK_SRC) with a stable frequency for use by clock generator circuit 802.

Data processing circuits (838-0/1) may process data values in response to an output clock CLK_OUT. In the embodiment shown, such processed data values may be synchronous with P_SYNC. An output clock CLK_OUT may be conceptualized as a master sample clock. Each data processing circuit (838-0/1) may frequency divide such a master sample clock (CLK_OUT) to arrive at a sample clock (CLK_SAMP0, -1) that may dictate the timing of data processing operations. In the figure shown, data processing circuit 838-0 may frequency divide CLK_OUT by "U" to generate CLK_SAMP0. Processing within section 840-0 may occur according to CLK_SAMP0. Similarly, data processing circuit 838-1 may frequency divide CLK_OUT by "V" to generate CLK_SAMP1 for section 840-1. In some embodiments, U and V may be integers.

While the embodiment of FIG. 8 may utilize a start-of-frame pulse as a synchronizing signal, other embodiments may derive a synchronizing signal in other ways. As but one example, a data I/F 804 may derive a synchronizing signal from received data signals. More particularly, a data I/F 804 may extract a synchronizing signal inherent in a serial bit stream. In one very particular embodiment, a data I/F 804 may be compatible with the standard IEC 60958 type II (Sony/Phillips Digital Interconnect Format, or S/PDIF), and may extract a synchronizing signal from data transmitted according to this protocol.

In this way, a clock synthesis system may generate an output clock that is synchronous with a synchronous signal/event and received by data processing circuits. Such data processing circuits may operate on data that is also synchronous with the synchronous signal/event.

Figure 9:
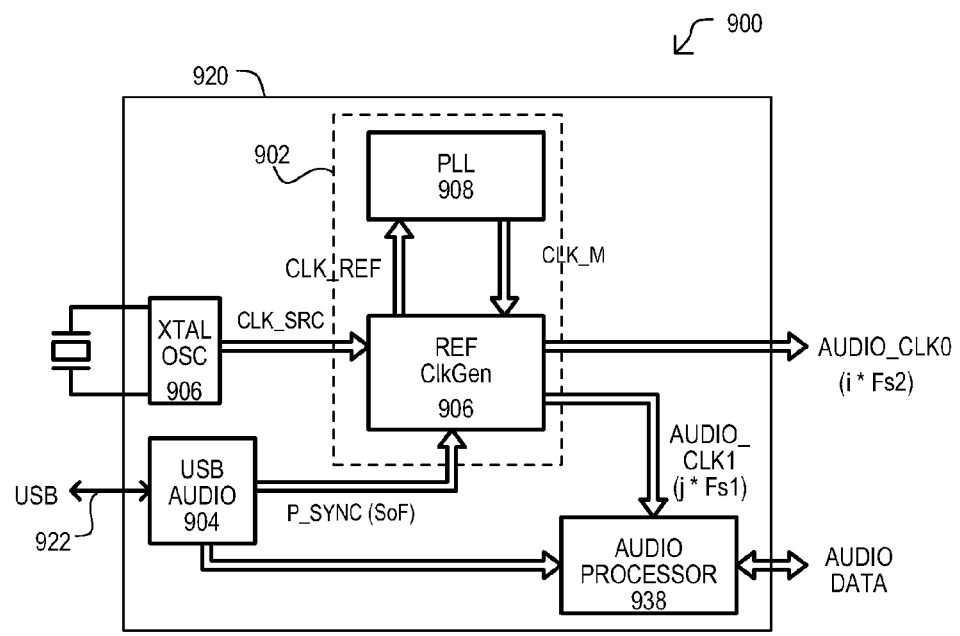
FIG. 9 shows an audio clock synthesis system according to an embodiment.

Referring now to FIG. 9, a clock synthesis system according to another embodiment is shown in a block schematic diagram and designated by the general reference character 900. A clock synthesis system 900 may generate clock signals for processing audio data in synchronism with a serial data timing signal. A clock synthesis system 900 may include a clock generator circuit 902, a crystal oscillator circuit 906, a serial communications interface 904 (in this embodiment a Universal Serial Bus (USB) type interface), and an audio processing circuit 938.

A clock generator 902 may include a reference clock generator 906 and a PLL 908. A reference clock generator 906 may generate a reference clock CLK_REF having a frequency that is a rational multiple of a P_SYNC pulse, as described for other embodiments herein. In one particular embodiment, CLK_REF may have a frequency that is a rational multiple of a USB start of frame (SoF) pulse having a frequency of about 1 kHz. Further, CLK_REF may be generated by frequency dividing a source clock CLK_SRC with dual, integer moduli. A frequency of CLK_SRC may be substantially greater than that of a USB SoF pulse, being in the megahertz range, more particularly in the tens of MHz, even more particularly greater than 20 MHz. In the embodiment shown, source clock CLK_SRC may be generated by a crystal oscillator circuit 906.

PLL 908 may frequency multiply CLK_REF to generate a master output clock CLK_M. It is noted that PLL dividing value may be programmable to enable master clock CLK_M to be changed for different applications.

Reference clock generator 906 may output CLK_M as an output audio clock (AUDIO_CLK0 and/or AUDIO_CLK1), and/or may frequency divide CLK_M to arrive at one or both audio clocks (AUDIO_CLK0 and/or AUDIO_CLK1). In the embodiment shown, reference clock generator 906 may provide one audio clock (AUDIO_CLK0) that is an integer multiple of one sampling frequency (Fs2) for encoded audio data, and/or can provide another audio clock (AUDIO_CLK1) that is that is an integer multiple of a another sampling frequency (Fs1) for differently encoded audio data. In very particular embodiments, Fs1 and Fs2 may be any of: 32 kHz, 44.1 kHz or 48 kHz.

USB interface 904 may receive and transmit data over a USB link 922, where such data is organized according to a start of frame (SoF) indication. The SoF indication may be used by clock generator circuit 902 as a synchronizing clock (P_SYNC), to which a reference clock REF_CLK (and hence CLK_M, AUDIO_CLK0, AUDIO_CLK1) are synchronized.

Audio processor 938 may process audio data in response to AUDIO_CLK1. In some embodiments, such audio data may be sampled at a rate Fs1, and may be received synchronously with P_SYNC.

Referring still to FIG. 9, the various portions of the clock synthesis system 900 may be included on a same IC 920. AUDIO_CLK0 may be provided as an output from IC 920 and serve as a timing signal for other devices external to the IC.

In this way, a clock synthesis system may generate one or more output audio clock values that are relatively large rational multiples of a serial communications interface timing signal/event.

Figure 10:
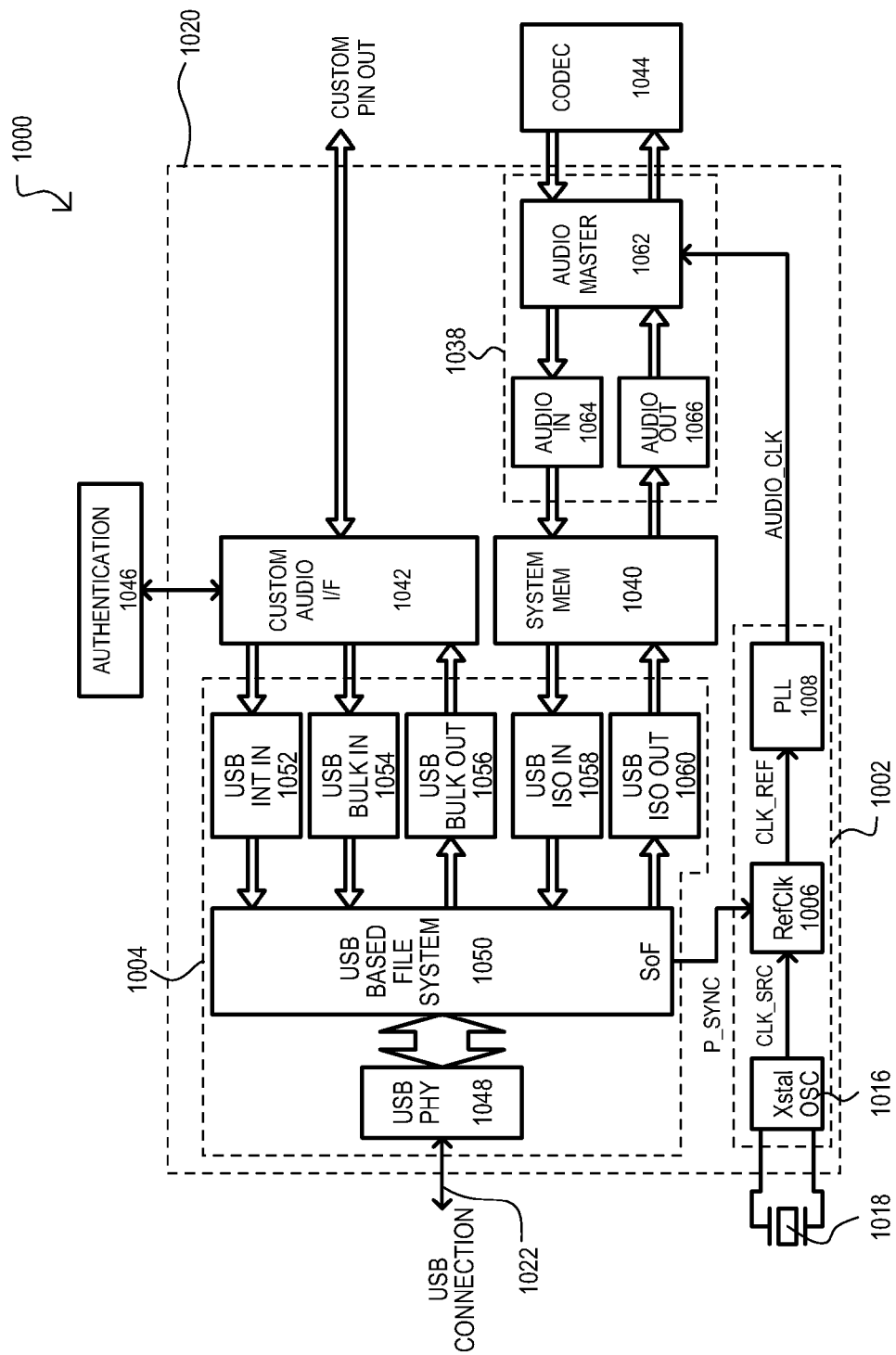
FIG. 10 shows an audio clock synthesis system according to an embodiment.

Referring now to FIG. 10, a clock synthesis system according to a very particular embodiment is shown in a block schematic diagram and designated by the general reference character 1000. A clock synthesis system 1000 may include sections like that shown in FIG. 9, and descriptions of like sections will not be repeated.

The embodiment of FIG. 10 differs from that of FIG. 9 in that it particularly shows a USB section 1004, a system memory 1040, a custom audio interface (I/F) 1042, an authentication section 1046, and an encoder/decoder circuit (CODEC) 1044.

A USB section 1004 may enable serial data transfers between a USB connection 1022 and either of custom audio I/F 1042 and data processing circuit 1038. A USB section 1004 may include a physical I/F circuit (PHY) 1048, and a file system 1050. PHY 1048 may provide an electrical connection to link 1022 to enable the reception and transmission of serial data. File system 1050 may store data for buffered transfers through USB section 1004. USB file system 1050 may also generate P_SYNC for use by clock generator circuit 1002, which in this embodiment may be a SoF pulse.

A USB section 1004 may communicate with custom audio I/F 1042 via an interrupt path 1052, first input data transfer path 1054 and first output data transfer path 1056. In the particular embodiment shown, first input data transfer path 1054 and first output data transfer path 1056 may be USB "bulk" transfer paths. USB section 1004 may also communicate with data processing circuits (in this case audio data processing circuit 1038) via a second input data transfer path 1058 and a second output data transfer path 1060. In the particular embodiment shown, second input data transfer path 1054 and second output data transfer path 1056 may be USB isochronous data transfer paths.

Custom audio I/F 1042 may communicate with authentication section 1046 to enable digital rights protection for audio data passing through such an interface. In the embodiment shown, custom audio I/F 1042 may be connected to a custom physical connection, which may include a custom pin out.

Audio data processing circuit 1038 may receive an AUDIO_CLK from clock generator circuit 1002. Such an audio clock may be synchronous with, and a large rational multiple of P_SYNC (i.e., a USB SoF indication), and may also be an integer multiple of a sample rate (Fs) of audio data that is processed. In FIG. 10, audio data processing circuit 1038 includes an audio master 1062, an audio data in path 1064, and an audio data out path 1066. Further, data transfers between audio data processing circuit 1038 may be by way of a system memory 1040. An audio master 1062 may decode and/or encode audio data received by use of CODEC 1044, which may execute decoding/encoding) algorithms suitable for a particular digital audio data encoding technique. Such encoding may have tightly governed synchronization to a SoF pulse due to the operation of clock generator circuit 1002. Further, as understood from other embodiments herein, AUDIO_CLK may rapidly track any variations in P_SYNC. It is also understood that by selection of system values (e.g., PLL divider values, count values (C0), and/or divider values (L)), an AUDIO_CLK may be generated to accommodate various different sampling frequencies.

Referring still to FIG. 10, in the embodiment shown, clock generator circuit 1002, USB section 1004, custom audio I/F 1042, system memory 1040, and audio processing circuit 1038 may all be part of a same IC device 1020, with a crystal 1016, serial link 1022, authentication section 1046, and CODEC 1044 having external connections to the IC 1020.

While FIG. 10 shows a USB section, alternate embodiments may include other communication blocks. Such communication blocks may be according to alternate serial communication standards, or may implement data transfers according to a parallel data transfer protocol/standard. That is, while some embodiments may advantageously utilize a serial communication synchronizing event (e.g., SoF), alternate embodiments may synchronize to timing signal unrelated to serial data transfer.

In this way, a clock synthesis system may generate one or more output audio clock values the same as, or at an integer multiple of, an audio data sampling rate. An audio processing circuit may utilize the audio clock value to processing audio data in combination with an audio CODEC.

It is understood that the various embodiments described above may be realized by one or more fixed function IC devices. For example, the devices may be formed in a custom IC. In addition or alternatively, all or a portion of the embodiments may be formed with one or more application specific ICs (ASICs).

However, additional embodiments may utilize programmable circuits to form all or a portion of the embodiments described above. Such programmability may enable such devices to meet numerous applications having different output frequency ranges, source clock signals, and/or synchronous events.

Figure 11:
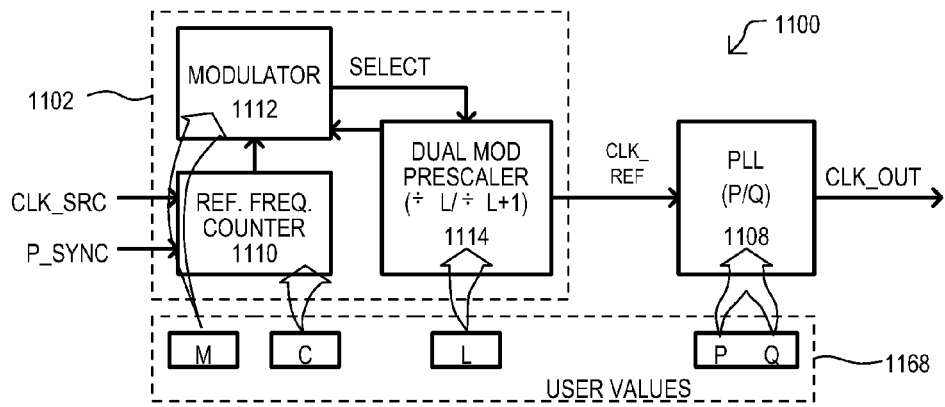
FIG. 11 shows user established values in a clock synthesis system according to an embodiment.

Referring to FIG. 11, a clock synthesis system 1100 according to an embodiment is shown in a block diagram. Clock synthesis system 1100 includes various sections described in embodiments above: a reference clock generator 1102 having a reference frequency counter 1110 that generates a difference value relative to a nominal count value C, a modulator 1112 operating with an offset value M, and a dual modulus prescaler that divides by L or L+1. A PLL 1108 may frequency multiply a reference clock CLK_REF by a value, where such a value may be an integer (e.g., P) or a rational value, such as P/Q, where P and Q are integers.

In system 1100 any or all of values C, M, L, P, or Q may be user set values. Such user set values may be established by a user to meet a rational multiplier value (W) relative to P_SYNC frequency as noted above. Establishing such values may include any of: writing a data value to a register, configuring programmable circuits with configuration data, loading instructions (e.g., firmware) for a processor, or setting a particular post fabrication option (e.g., bond option, selectively opening fusible links, selectively enabling anti-fuse type links), as but a few of many possible approaches.

In this way, variables utilized by a clock synthesis system may be established by a user setting one or more values within a device.

Figure 12A:
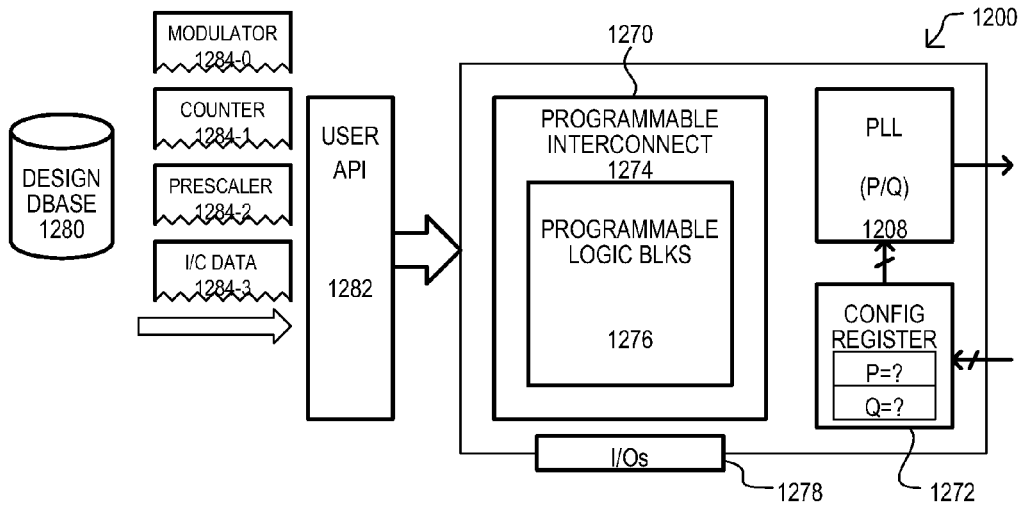
FIGS. 12A and 12B show a configurable clock synthesis system and method according to an embodiment.
Figure 12B:
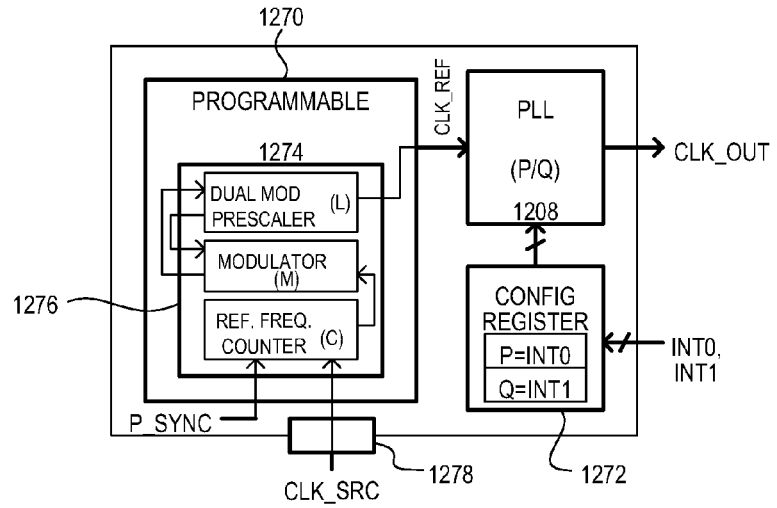

Referring now to FIGS. 12A and 12B, a clock synthesis system and method according to a further embodiment is shown in a sequence of block diagrams. FIGS. 12A and 12B show an embodiment in which sections of a clock synthesis system may be formed by both programmable circuits and fixed function circuits. While various alternate embodiments may include different mixes of programmable and fixed function circuits, in the very particular embodiment of FIGS. 12A/B, a reference clock generator 1202 may be formed with programmable logic circuits while a PLL 1208 may be a fixed function circuit (but having divider/multiplier values configurable via registers, as will be described below).

Referring to FIG. 12A, an IC 1220 may include programmable circuits 1270, a PLL 1208, PLL configuration register 1272, and I/Os 1278. Programmable circuits 1270 may include programmable interconnect (I/C) 1274 and programmable logic blocks 1276. In response to user provided configuration data, programmable interconnect (I/C) 1274 and programmable logic blocks 1276 may be configured to execute predetermined functions and have a designated signal paths. PLL 1208 may provide a frequency multiplying and/or dividing function based on values stored within PLL configuration register 1272. In the embodiment shown, PLL configuration registers 1272 may be loaded with integers P and Q, which may establish input and feedback clock divider values.

FIG. 12A shows hardware programming operation according to one embodiment. Circuit design blocks may reside in a design database 1280 in a format natively compatible to the IC 1220 (binary configuration files), or such designs may exist in a higher level hardware design language synthesizable into configuration data suitable for IC 1220 via a user application interface (API) 1282. In the very particular operation shown, modulator design data 1284-0, counter design data 1284-1, prescaler design data 1284-2, and interconnect design data 1284-3 may be loaded into IC 1220 via user API 1282.

FIG. 12B shows IC 1220 following a hardware programming operation. In response to modulator design data 1284-0, counter design data 1284-1, prescaler design data 1284-2, programmable logic blocks 1270 may be programmed into a reference frequency counter 1210, a modulator 1212, and dual modulator prescaler 1214. According to interconnect data 1284-3, such circuit sections (1210, 1212, 1214) may be interconnected to form a reference clock generator that provides a reference clock CLK_REF as an input to PLL 1208, and I/Os 1278 may be connected as inputs (CLK_SRC and P_SYNC) to reference frequency counter 1210.

FIG. 12B also shows PLL configuration registers 1272 being loaded with integer values INT0 and INT1 such that P=INT0 and Q=INT1.

In one embodiment, operational values within programmable circuit sections (e.g., a nominal frequency counter value (C), modulator offset value (M), prescaler division value L) may be established by the hardware configuration data, and hence may not be changed without a hardware reprogramming operation. However, in other embodiments, any or all of circuit sections (1210, 1212, 1214) may have registers to program such values.

In this way, a clock synthesis system that generates an output clock that is a rational multiple of a synchronizing event may be formed all, or in part, with programmable circuits.

Figure 13:
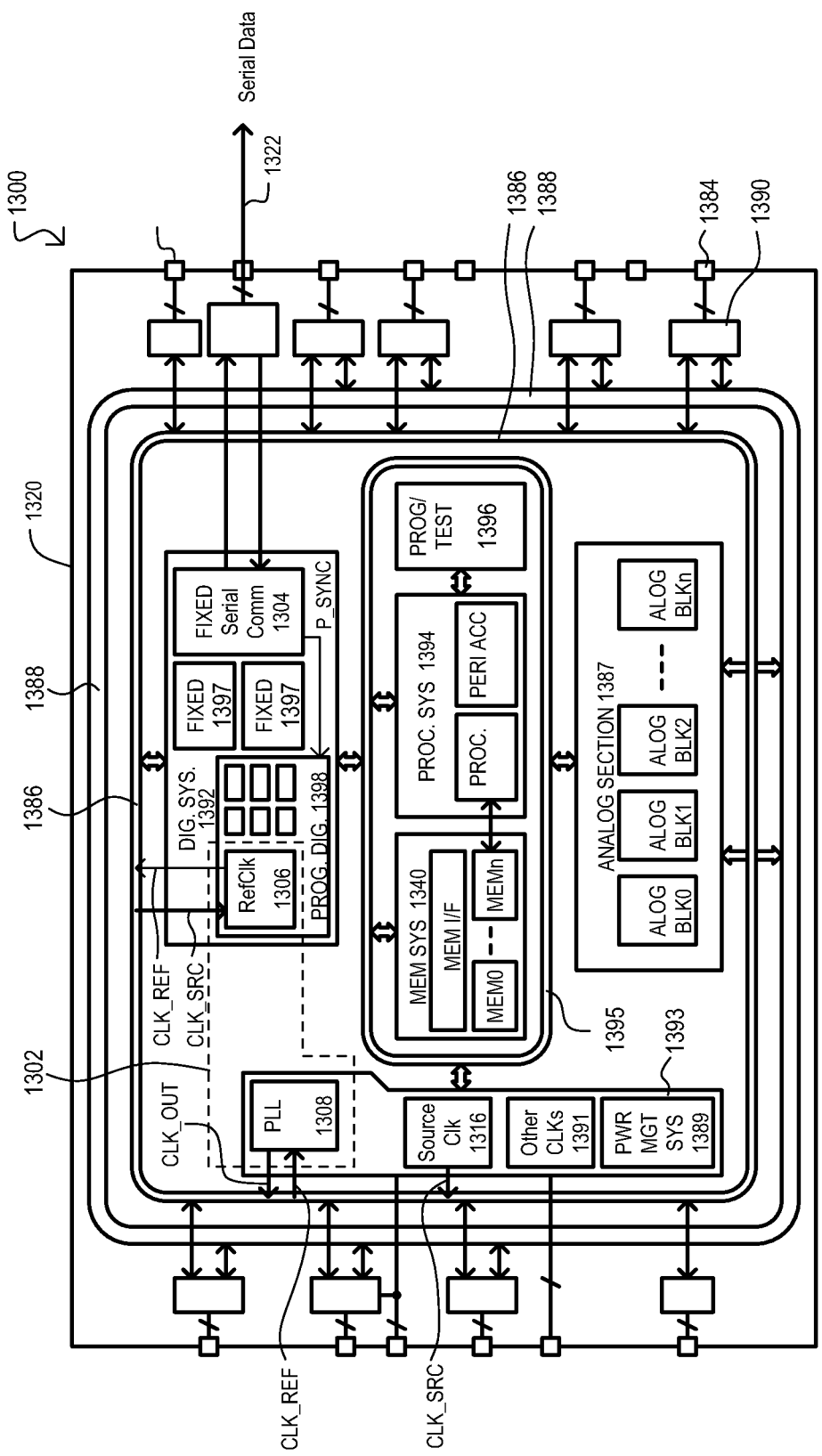
FIG. 13 shows a configurable clock synthesis system implemented on a programmable system on chip according to an embodiment.

Referring now to FIG. 13, a clock synthesis system according to a further embodiment is shown in a block diagram and designated by the general reference character 1300. A clock synthesis system 1300 may be implemented on a "system-on-chip" IC 1320 that provides both programmable functions as well as fixed functions. In the particular embodiment shown, IC 1320 may provide programmable analog functions, programmable digital functions, fixed digital functions, and fixed analog functions. An IC 1320 may include a digital section (described in more detail below), an analog section (described in more detail below), and a system resource section 1393.

In the embodiment of FIG. 13, external pins (one group shown as 1384) may have connections to a digital system interconnect (DSI) 1386 and/or an analog interconnect 1388, either directly, or by way of programmable I/O paths (one shown as 1390).

A digital section may include a digital system 1392, a memory system 1340, a processor system 1394, and a program and test system 1396. A digital system 1392 may include programmable digital section 1398 as well as a number of fixed function digital blocks (1397, 1304). In the embodiment shown, programmable digital section 1398 may be programmed to include a reference clock generator circuit 1306, which may generate a reference clock (CLK_REF) in response to a source clock (CLK_SRC) and a synchronizing signal/event (P_SYNC) as described herein and equivalents. Further, in the embodiment shown, a fixed function digital block 1304 may be a serial communication block connected to a serial communication link 1322. Serial communications block 1304 may provide a synchronizing signal (P_SYNC) to reference clock generator circuit 1306. A DSI 1386 may provide digital connection between various sections of the digital system 1392 and/or connections to suitably configured external pins (e.g., 1384).

A memory system 1340 may include one or more memories (MEM0 to -n) of various types, including but not limited to a static random access memory (SRAM), nonvolatile memory (including EEPROMs, and flash EEPROM). A processor system 1394 may include a processor (PROC) as well as peripheral access system (PERI ACC). A processor may include one or more processors as well as corresponding circuits such as memory controller (including cache controllers) and an interrupt control circuit. A peripheral access system may include circuits such as a direct access circuit, and/or a data transfer hub circuit, or equivalents.

A program and test system 1396 may include circuits that enable data to be loaded into memory system (program data for execution by processor system 1394), as well as test circuits for providing test data to and test result data from an IC 1320.

Memory system 1340 and processor system 1394 may be connected to a system bus 1344. A system bus 1344 may also be connected to a digital section, an analog section, and system resources 1393.

System resources 1393 may include a PLL 1308, a source clock circuit 1316, other clock circuits 1391, and a power management system 1389. PLL 1308 in combination with reference clock generator 1306 may form a clock generator circuit 1302 for providing an output clock CLK_OUT. A source clock circuit 1316 may provide a source clock (CLK_SRC) for use by reference clock generator circuit 1306 to generate a reference clock CLK_REF. In some embodiments, a source clock circuit 1316 may be a crystal oscillator circuit. However, in other embodiments source clock circuit 1316 may be another oscillator circuit built-in to an IC device 1320 (and which may not require an external crystal). Other clock circuits 1391 may provide timing signals to various portions of IC 1320. A power management system 1389 may provide power supply voltages and regulation to various portions of an IC 1389. A power management 1389 may selectively disable portions of the device for low power (i.e., sleep) modes of operation.

Referring still to FIG. 13, an analog section 1387 may include a number of analog blocks (ALOG BLK0 to n) which may be connected to external pins (e.g., 1384) through analog interconnect 1388. Analog blocks (ALOG BLK0 to n) may include analog circuits that execute analog circuit functions. Selected or all of analog blocks (ALOG BLK0 to n) may also receive and/or output digital data to digital section. Analog blocks (ALOG BLK0 to n) may include various analog circuits, including but not limited to capacitance sense circuits, comparators, analog-to-digital-converters (ADCs) (including "sigma-delta" types and/or successive approximation types), filters (including low pass filters), switched capacitor type circuits, and/or digital-to-analog converters (DACs) (including both current and/or voltage DACs).

In this way, a clock synthesis system that generates an output clock that is a rational multiple of a synchronizing event may be formed on a programmable system on chip.

While particular embodiments have shown audio data processing systems, alternate embodiments may include numerous other applications. Two such alternate embodiments will now be described with reference to FIGS. 14 and 15.

Figure 14:
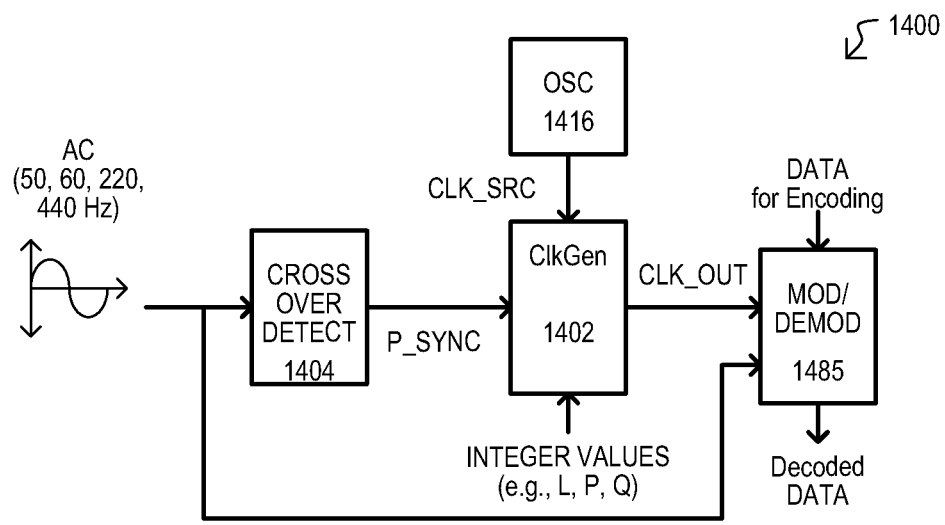
FIG. 14 shows a power line clock synthesis system according to an embodiment.

Referring to FIG. 14, a clock synthesis system according to another embodiment is shown in a block schematic diagram and designated by the general reference character 1400. A clock synthesis system 1400 may generate an output signal CLK_OUT that may be synchronized to an alternating current (AC) power line waveform. A clock synthesis system 1400 may include a cross over detection circuit 1404, a source clock circuit 1416, a clock generator circuit 1402, and a demodulator/modulator 1485.

A cross over detection circuit 1404 may detect when an AC line voltage crosses over a zero voltage level, and in response to such a cross over event, generate a signal P_SYNC.

A clock generator circuit 1402 may generate an output signal CLK_OUT in response to a source clock CLK_SRC and P_SYNC as described for other embodiments herein. In particular, an output clock CLK_OUT may be synchronous with P_SYNC, and have a frequency that is a rational multiple of the P_SYNC frequency.

A source clock circuit 1416 may generate a source clock CLK_SRC. In one embodiment, a source clock circuit 1416 may be a built-in oscillator circuit of an integrated circuit that also includes the clock generator circuit 1402.

A demodulator/modulator 1485 may demodulate data carried on AC line voltage to generate decoded data. In addition or alternatively, a demodulator/modulator 1485 may modulate data onto an AC line voltage to generate a modulated AC line signal.

In this way, a clock synthesis system may generate one or more output clocks that are relatively large rational multiples of an AC line voltage.

Figure 15:
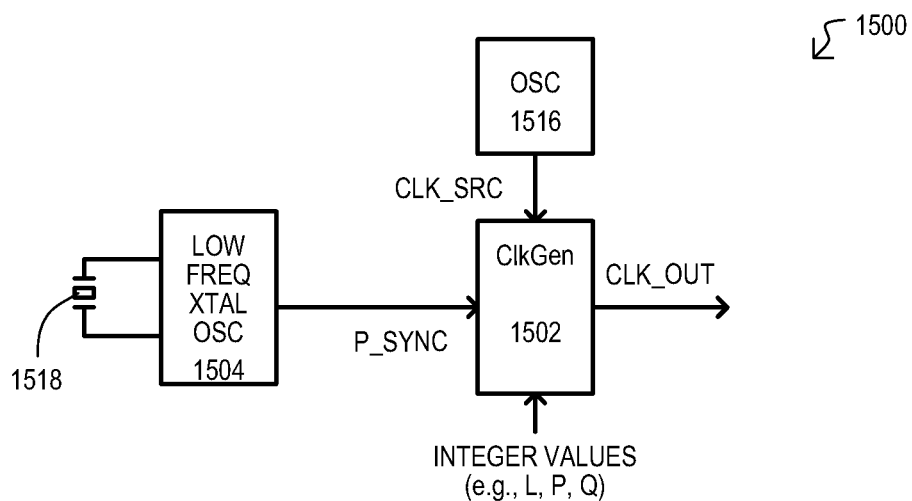
FIG. 15 shows a low power clock synthesis system according to an embodiment.

Referring to FIG. 15, a clock synthesis system according to still another embodiment is shown in a block schematic diagram and designated by the general reference character 1500. A clock synthesis system 1500 may generate an output signal CLK_OUT that may be synchronized to a relatively low crystal oscillator frequency. A relatively low crystal oscillator frequency may be less than 1 MHz, more particularly, less than 100 kHz, even more particularly, less than about 50 kHz. A clock synthesis system 1500 may include a low frequency crystal oscillator circuit 1504, a clock generator circuit 1502, and a source clock circuit 1516.

A low frequency crystal oscillator circuit 1504 may oscillate at a frequency determined by crystal 1518, and output a signal P_SYNC at such an oscillating frequency. In one embodiment, a crystal may be a "watch crystal", and P_SYNC may have a frequency of about 32,768 Hz.

A clock generator circuit 1502 may generate an output signal CLK_OUT in response to a source clock CLK_SRC and P_SYNC as described for other embodiments herein. In particular, an output clock CLK_OUT may be synchronous with P_SYNC, and have a frequency that is a rational multiple of the P_SYNC frequency.

A source clock circuit 1516 may generate a source clock CLK_SRC. In one embodiment, a source clock circuit 1516 may be a built-in oscillator circuit of an integrated circuit that includes the clock generator circuit 1502.

In this way, a clock synthesis system may generate one or more output clocks that are relatively large rational multiples of, and synchronous with, a low frequency crystal oscillator.

Having shown systems, devices and methods in various block diagrams above, particular methods will now be described with reference to flow diagrams.

Figure 16:
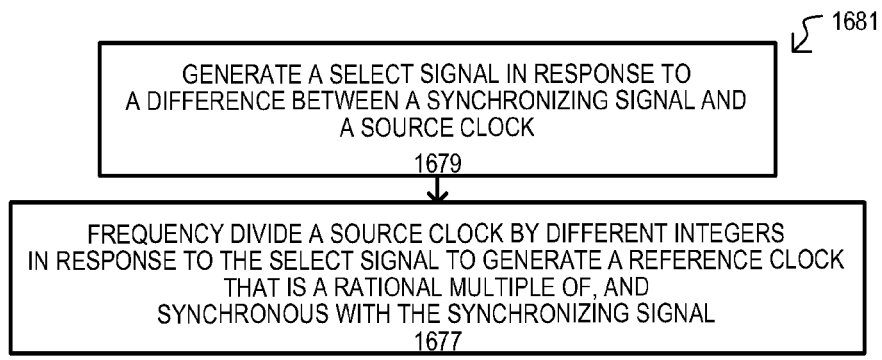
FIG. 16 is a flow diagram showing a method according to an embodiment.

Referring now to FIG. 16, a method according to an embodiment is shown in a flow diagram and designated by the general reference character (1681). A method 1681 may include generating a select signal in response to a difference between a synchronizing signal and a source clock (1679). In a particular embodiment, such a step may include comparing a number of source clock signals that occur synchronizing clock pulses to an ideal value. A source clock signal may then be frequency divided by different integers in response to a select signal to generate a reference clock (1677). Such a reference clock may be a rational multiple of, and synchronous with, the synchronizing signal.

Figure 17:
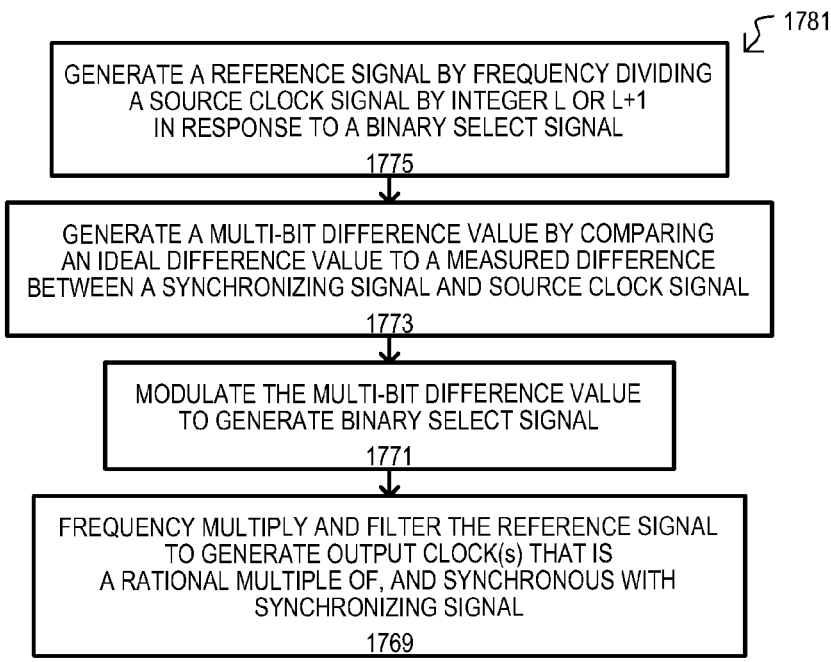
FIG. 17 is a flow diagram showing a method according to another embodiment.

Referring now to FIG. 17, another method 1781 according to an embodiment is shown in flow diagram. A method 1781 may include generating a reference signal by frequency dividing a source clock signal by an integer L or L+1 in response to a binary select signal (1775). A multi-bit difference value may be generated by comparing an ideal difference value to a measured difference value between a synchronizing signal and source clock signal (1773). Such a multi-bit value may be modulated to generate the binary select signal (1771). The reference signal may be frequency multiplied and filtered to generate one or more output clocks, each of which is a rational multiple of, and synchronous with, the synchronizing signal (1769). Filtering may suppress sideband frequencies arising from the modulation occurring in box 1771.

Figure 18:
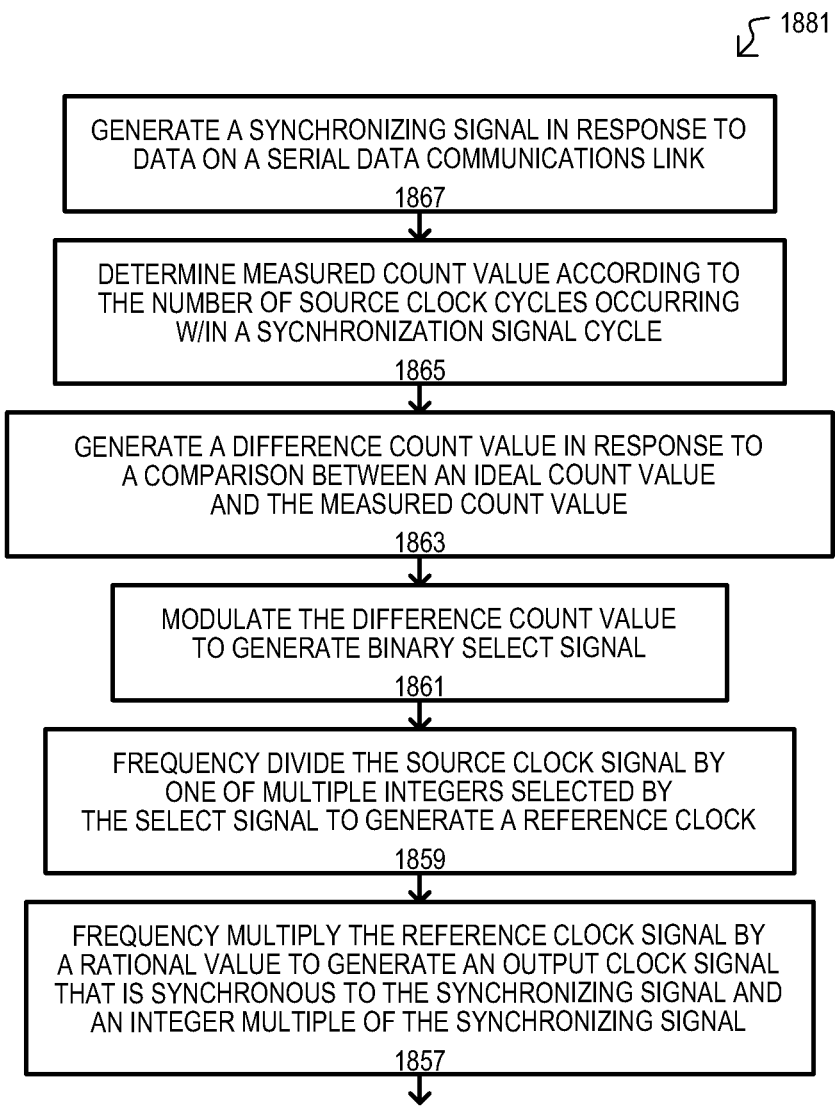
FIG. 18 is a flow diagram showing a method according to a further embodiment.

Referring now to FIG. 18, a method 1881 according to a further embodiment is shown in flow diagram. A method 1881 may include generating a synchronizing signal in response to data on a serial communications link (1867). In some embodiments, such actions may include generating a synchronizing signal in response to a serial data timing value, even more particularly, generating a synchronizing signal in response to a start of frame indication. A method may further determine a measured count value according to the number of source clock cycles occurring within a synchronization signal cycle (1865). A difference count value may be generated in response to a comparison between an ideal count value and measured count value (1863). A difference count value may be modulated to generate a binary select signal (1861). A source clock signal may be frequency divided by one of multiple integers selected by the select signal to generate a reference clock (1859). A reference clock signal may be frequency multiplied by a rational value to generate an output clock signal that is synchronous to the synchronizing signal and a rational multiple of the synchronizing signal (1857).

Embodiments of the invention may arrive at exact, fast-responding, low jitter clock multiplication by a large factor. As noted above, particular embodiments may generate audio sampling clocks at frequencies that are tens of thousands of times after than, but rigorously locked to, a serial data start of frame indicator. Even more particularly, for some digital audio conversion applications output clocks of 45.1584 MHz (1024*44.1 kHz) and/or 49.152 MHz (1024*48 kHz) may be synthesized that are locked to a USB start of frame pulse having a frequency of about 1 kHz. Jitter may be smaller than 1 ns peak-to-peak.

As also noted above, embodiments of the invention may generate an output clock having a free running frequency at a desired nominal value in the absence of the lower frequency synchronizing signal. Such a feature may allow for rapid locking to the synchronizing signal upon its occurrence. This is contrast to some PLL approaches that require some convergence time to achieve frequency lock following the detection of the synchronizing signal. In digital audio conversion applications like those noted above, stabilization of an output frequency may be achieved within a few audio sampling periods (e.g., <100 us). In contrast, some a multiple PLL solutions may take milliseconds to arrive an output signal with acceptably small jitter.

Particular embodiments of the invention may synchronize various types of digital audio data conversion to timing signals/events at significantly lower frequencies. As but a few examples, embodiments may provide timing signals for conversion circuits operating on audio data transmitted according to the I²S standard originally promulgated by Philips Semiconductor and/or the S/PDIF standard discussed previously, as but two examples.

It should be appreciated that in the foregoing description of exemplary embodiments. Various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

It is also understood that the embodiments of the invention may be practiced in the absence of an element and/or step not specifically disclosed. That is, a feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A clock synthesis system, comprising:
   a feed forward stage including a divider circuit configured to divide a source clock signal by one of a plurality of integers in response to a select signal to generate a reference clock that is synchronous to a synchronization pulse;
   a modulator that modulates the select signal in response to at least a difference value;
   a multiplier circuit that frequency multiplies the reference clock to generate an output clock, wherein the frequency multiplication of the reference clock is performed by a phase lock loop (PLL) circuit after the division of the source clock signal and the modulation of the select signal; and
   a timing circuit that generates the difference value in response to the source clock signal and synchronization pulse.

2. The clock synthesis system of claim 1, wherein:
   the modulator comprises a pulse density modulator; and
   the divider circuit comprises a dual modulus prescaler that divides by integers L or L+1 in response to a logic state of the select signal.

3. The clock synthesis system of claim 1, wherein:
   the modulator comprises a delta-sigma modulator that encodes at least the difference value into a pulse stream to generate the select signal.

4. The clock synthesis system of claim 1, wherein:
   the timing circuit comprises a counter that generates the difference value by comparing an ideal count to a measured count of source clock cycles occurring between synchronous pulses.

5. The clock synthesis system of claim 1, wherein:
   the multiplier circuit comprises a phase locked loop having a frequency dividing value Q and frequency multiplying value P, such that $$f_{output} = P/Q * f_{reference}$$

where, $f_{output}$ is the frequency of the output clock, $f_{reference}$ is the frequency of the reference clock, and P and Q are integer values selected from a plurality of integer values.

6. The clock synthesis system of claim 1, further including:
   serial communications interface configured to receive serial data synchronized with the synchronous pulse.

7. The clock synthesis system of claim 6, further including:
   the serial communications interface is selected from: a Universal Serial Bus (USB) interface or a S/PDIF interface.

8. A clock synthesis system, comprising:
   a frequency synthesis circuit that divides a source clock by different integer values in response to at least a difference between the source clock and a synchronous clock to generate a reference clock, wherein the reference clock is an audio clock capable of being used to process audio data; and
   a multiplier circuit that generates at least one output clock by frequency multiplying the reference clock, wherein the frequency multiplying of the reference clock is performed by a phase lock loop (PLL) circuit after the division of the source clock; and wherein
   the synchronous clock is slower than the source clock and the reference clock, and the at least one output clock is a rational multiple of, and synchronous with, the synchronous clock.

9. The clock synthesis system of claim 8, wherein:
   the frequency synthesis circuit comprises a dual modulus prescaler circuit that divides the source clock by either integer L or L+1.

10. The clock synthesis system of claim 8, further including:
    the multiplier circuit comprises a phase locked loop (PLL) having a frequency dividing value Q and frequency multiplying value P, where Q and P are integers; and
    PLL configuration registers configured to receive values Q and P as write values received from a source external to the clock synthesis system.

11. The clock synthesis system of claim 8, wherein:
    the synchronous clock is generated from a synchronous event source selected from the group of: a start-of-frame pulse for a serial communications signal, an alternate current (AC) line voltage, and a crystal oscillator output having a frequency less than 50 kHz.

12. The clock synthesis system of claim 8, wherein:
    at least the frequency synthesis circuit comprises programmable logic circuits configured by configuration data.

13. The clock synthesis system of claim 8, further including:
    a serial communications interface that generates the synchronous clock in response to signals on a serial communications channel; and
    at least one data processing circuit that processes data transmitted in synchronism with the synchronous clock; wherein
    he at least one data processing circuit is selected from the group of: data converter circuits that convert data in synchronism with the synchronous clock, including analog-to-digital converter circuits and digital-to-analog converter circuits; encoding or decoding circuits that encode or decode data in synchronism with the synchronous clock; and
    modulating or demodulating circuits that modulate at least one carrier signal with data or demodulate data from at least one modulated carrier signal.

14. The frequency synthesis system of claim 13, wherein:
    the serial communications interface is selected from the group that includes: a Universal Serial Bus Interface and a S/PDIF compatible interface.

15. A method, comprising:
    dividing a source clock by multiple integer values based on a select signal to generate a reference clock signal that is synchronous with, and a rational multiple of, a synchronization pulse input;
    modulating the select signal in response to at least a difference value generated in response to a difference between the synchronization pulse input and the source clock; and
    frequency multiplying and filtering the reference clock signal to generate an output signal, wherein the frequency multiplying and filtering of the reference clock signal is performed by a phase lock loop (PLL) circuit after the dividing of the source clock and the modulating of the select signal.

16. The method of claim 15, wherein:
dividing the source clock includes dividing by an integer L or L+1 according to the select signal.

17. The method of claim 15, wherein:
modulating the select signal includes encoding at least a difference between an ideal value and the difference value into a variable pulse density signal.

18. The method of claim 15, further including:
receiving the synchronous pulse input at an external serial communication connection; and
processing data received at the serial connection in synchronism with the master clock.

19. The method of claim 18, wherein:
the synchronous pulse is generated in response to a Universal Serial Bus start-of-frame pulse.

20. The method of claim 18, wherein:
processing data includes steps selected from the group that includes: generating analog output audio data in response to digital input audio data; generating audio output data according to the FS standard; and generating audio output data according to the S/PDIF standard.

* * * * *